United States Patent
Debbins et al.

(10) Patent No.: US 6,362,620 B1
(45) Date of Patent: *Mar. 26, 2002

(54) MR IMAGING SYSTEM WITH INTERACTIVE IMAGE CONTRAST CONTROL OVER A NETWORK

(75) Inventors: Josef P. Debbins; Roshy J. Francis; Richard J. Prorok, all of Waukesha; Lawrence E. Ploetz, Brookfield, all of WI (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/473,218

(22) Filed: Dec. 27, 1999

Related U.S. Application Data

(63) Continuation-in-part of application No. 09/200,158, filed on Nov. 25, 1998, now Pat. No. 6,166,544.

(51) Int. Cl.[7] ................................................ G01V 3/00
(52) U.S. Cl. ........................................ 324/309; 324/314
(58) Field of Search ................................. 324/307, 309, 324/300, 312, 306, 314, 318, 322

(56) References Cited

U.S. PATENT DOCUMENTS

| | | | |
|---|---|---|---|
| 4,707,797 A | 11/1987 | Briggs | 364/607 |
| 4,830,012 A | 5/1989 | Riederer | 128/653 |
| 5,345,176 A | 9/1994 | LeRoux et al. | 324/309 |
| 5,451,876 A | 9/1995 | Sandford et al. | 324/322 |
| 5,498,963 A | 3/1996 | Schneider et al. | 324/309 |
| 5,512,827 A | 4/1996 | Hardy et al. | 324/309 |
| 5,541,513 A | 7/1996 | Maier | 324/309 |
| 5,560,361 A | 10/1996 | Glusick | 128/653.2 |
| 5,584,293 A | 12/1996 | Darrow et al. | 128/653.2 |
| 5,606,258 A | 2/1997 | Hoenninger, III et al. | 324/309 |
| 5,657,757 A | 8/1997 | Hurd et al. | 128/653.2 |
| 5,711,300 A | 1/1998 | Schneider et al. | 128/653.2 |
| 5,749,834 A | 5/1998 | Hushek | 600/410 |
| 5,810,729 A | 9/1998 | Hushek et al. | 600/410 |
| 6,157,194 A * | 12/2000 | Vassallo et al. | 324/322 |
| 6,166,544 A * | 12/2000 | Debbins et al. | 324/309 |
| 6,198,283 B1 * | 3/2001 | Foo et al. | 324/309 |

FOREIGN PATENT DOCUMENTS

| | | |
|---|---|---|
| EP | 0 567 794 | 11/1993 |
| WO | WO 91/00530 | 1/1991 |
| WO | WO 95/34242 | 12/1995 |

* cited by examiner

Primary Examiner—Louis Arana
(74) Attorney, Agent, or Firm—Foley & Lardner; Peter J. Vogel; Michael A. Della Penna

(57) ABSTRACT

An interactive magnetic resonance (MR) imaging system includes a MR imaging device, a network coupling the MR imaging device and a remote facility, an operator interface coupled to the MR imaging device and the network, a memory coupled to the MR imaging device, and a sequence controller coupled to the memory. The MR imaging device is configured to acquire and reconstruct MR data in real-time of a current imaging section and display a MR image in real-time of the current imaging section. The network provides remote services to the MR imaging device. The operator interface permits an operator to select from a plurality of image contrast mechanisms. The memory stores a plurality of image contrast waveform segments and at least one imaging waveform segment. Each of the plurality of image contrast waveform segments and the at least one imaging waveform segment is distinctly addressable such that each waveform segment can be independently accessed from the memory. The sequence controller dynamically links the selected image contrast waveform segments and one imaging waveform segment, causing the MR imaging device to acquire a new image with the selected waveform segment mechanisms.

28 Claims, 8 Drawing Sheets

MR IMAGING SYSTEM WITH INTERACTIVE IMAGE CONTRAST CONTROL OVER A NETWORK

CROSS-REFERENCE TO RELATED APPLICATIONS

This application is a continuation-in-part (CIP) of U.S. patent application Ser. No. 09/200,158, entitled "MR Imaging System With Interactive Image Contrast Control" by Debbins et al. filed on Nov. 25, 1998 now U.S. Pat. No. 6,166,544

BACKGROUND OF THE INVENTION

The present invention relates generally to the field of medical diagnostic systems, such as imaging systems. More particularly, the invention relates to a system and technique for interactive image contrast prescription control.

When a substance such as human tissue is subjected to an uniform magnetic field (polarizing field Bo), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, $M_z$, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals (also referred to as MR signals) are digitized and processed to reconstruct the image using one of many well known reconstruction techniques.

When viewing an MR image of a structure of interest, such as an anatomical section, the MR imaging system operator may desire to view an MR image in which one or more types of tissue comprising the anatomical section is contrasted with respect to the remaining types of tissue of the anatomical section. Moreover, the operator may desire to modify the image contrast of an MR image acquisition in progress or to prescribe the image contrast prior to an MR image acquisition.

Currently, various image contrast mechanisms such as chemical saturation and spatial saturation are used in MR imaging to generate images of varying contrast. For example, chemical saturation is used to suppress the relatively large magnetization signal from fatty tissue. Each image contrast mechanism is made possible by a corresponding magnetization preparation applied to the anatomical section prior to the MR scan. Briefly, magnetization preparation involves preparing the spin state in the bore such that the anatomical section to be imaged is in a certain magnetized state immediately before the regular image scanning commences. Thus, to acquire an MR image with image contrast, the MR imaging system executes an MR imaging pulse sequence comprised of at least two sets of waveform segments—at least one set of image contrast waveform segment and a set of (regular) imaging waveform segment.

In conventional MR imaging systems, the MR imaging pulse sequence responsible for a specific image contrast mechanism is typically constructed and stored in the MR imaging system prior to scanning. In particular, the MR imaging pulse sequence is comprised of the specific image contrast waveform segment permanently linked to the imaging waveform segment, thus one waveform set. When an operator desires this specific image contrast mechanism, this all-inclusive pulse sequence is evoked and executed in its entirety, The drawback of this type of pulse sequence architecture is that the operator must wait until the image acquisition in progress is completed before new desired image contrast mechanism(s) can be applied. Furthermore, even if the amplitudes of the image contrast waveform segment of the MR imaging pulse sequence can be set to zero while the image acquisition is in progress, essentially prescribing a new image contrast mechanism during acquisition, there is no reduction in acquisition time because the zero amplitude image contrast waveform segment portion must still be executed along with the rest of the MR imaging pulse sequence.

Solutions to the problems described above have not heretofore included significant remote capabilities. In particular, communication networks, such as, the Internet or private networks, have not been used to provide remote services to such medical diagnostic systems. The advantages of remote services, such as, remote monitoring, remote system control, immediate file access from remote locations, remote file storage and archiving, remote resource pooling, remote recording, remote diagnostics, and remote high speed computations have not heretofore been employed to solve the problems discussed above.

Thus, there is a need for a medical diagnostic system which provides for the advantages of remote services and addresses the problems discussed above. In particular, there is a need for interactive image contrast control including remote control via a network. Further, there is a need for manipulation of MR imaging systems remotely via a network.

SUMMARY OF THE INVENTION

One embodiment of the invention relates to an interactive magnetic resonance (MR) imaging system. The system includes a MR imaging device, a network coupling the MR imaging device and a remote facility, an operator interface coupled to the MR imaging device and the network, a memory coupled to the MR imaging device, and a sequence controller coupled to the memory. The MR imaging device is configured to acquire and reconstruct MR data in real-time of a current imaging section and display a MR image in real-time of the current imaging section. The network provides remote services to the MR imaging device. The operator interface permits an operator to select from a plurality of image contrast mechanisms. The memory stores a plurality of image contrast waveform segments and at least one imaging waveform segment. Each of the plurality of image contrast waveform segments and the at least one imaging waveform segment is distinctly addressable such that each waveform segment can be independently accessed from the memory. The sequence controller dynamically links the selected image contrast waveform segments and one imaging waveform segment, causing the MR imaging device to acquire a new image with the selected waveform segment mechanisms.

Another embodiment of the invention relates to a method for interactively and remotely controlling the image contrast of a real-time magnetic resonance (MR) image produced in a MR system. The method includes a) establishing a communication connection over a network between the MR system and a remote facility; b) storing a plurality of image contrast waveform segments in a waveform memory of the MR system; c) storing at least one imaging waveform segment in the waveform memory of the MR system; d) selecting from the plurality of image contrast waveform segments stored in the waveform memory; e) selecting from the at least one imaging waveform segment stored in the waveform memory; f) constructing a MR imaging pulse sequence in real-time by a sequence controller dynamically linking the selected image contrast waveform segment to the selected imaging waveform segment stored in the waveform memory at run-time; g) acquiring MR data using the dynamically linked MR imaging pulse sequence in real-time; h) reconstructing the MR data acquired in real-time; and i) displaying the newly acquired MR image as the current image.

Another embodiment of the invention relates to an interactive magnetic resonance (MR) imaging system. The system includes a) means for establishing a communication connection over a network between the MR system and a remote facility; b) means for storing a plurality of image contrast waveform segments in a waveform memory of the MR system; c) means for storing at least one imaging waveform segment in the waveform memory of the MR system; d) means for selecting from the plurality of image contrast waveform segments stored in the waveform memory; e) means for selecting from the at least one imaging waveform segment stored in the waveform memory; f) means for constructing a MR imaging pulse sequence in real-time by a sequence controller dynamically linking the selected image contrast waveform segment to the selected imaging waveform segment stored in the waveform memory at run-time; g) means for acquiring MR data using the dynamically linked MR imaging pulse sequence in real-time; h) means for reconstructing the MR data acquired in real-time; and i) means for displaying the newly acquired MR image as the current image.

Other principle features and advantages of the present invention will become apparent to those skilled in the art upon review of the following drawings, the detailed description, and the appended claims.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE PREFERRED EMBODIMENT

Figure 1:
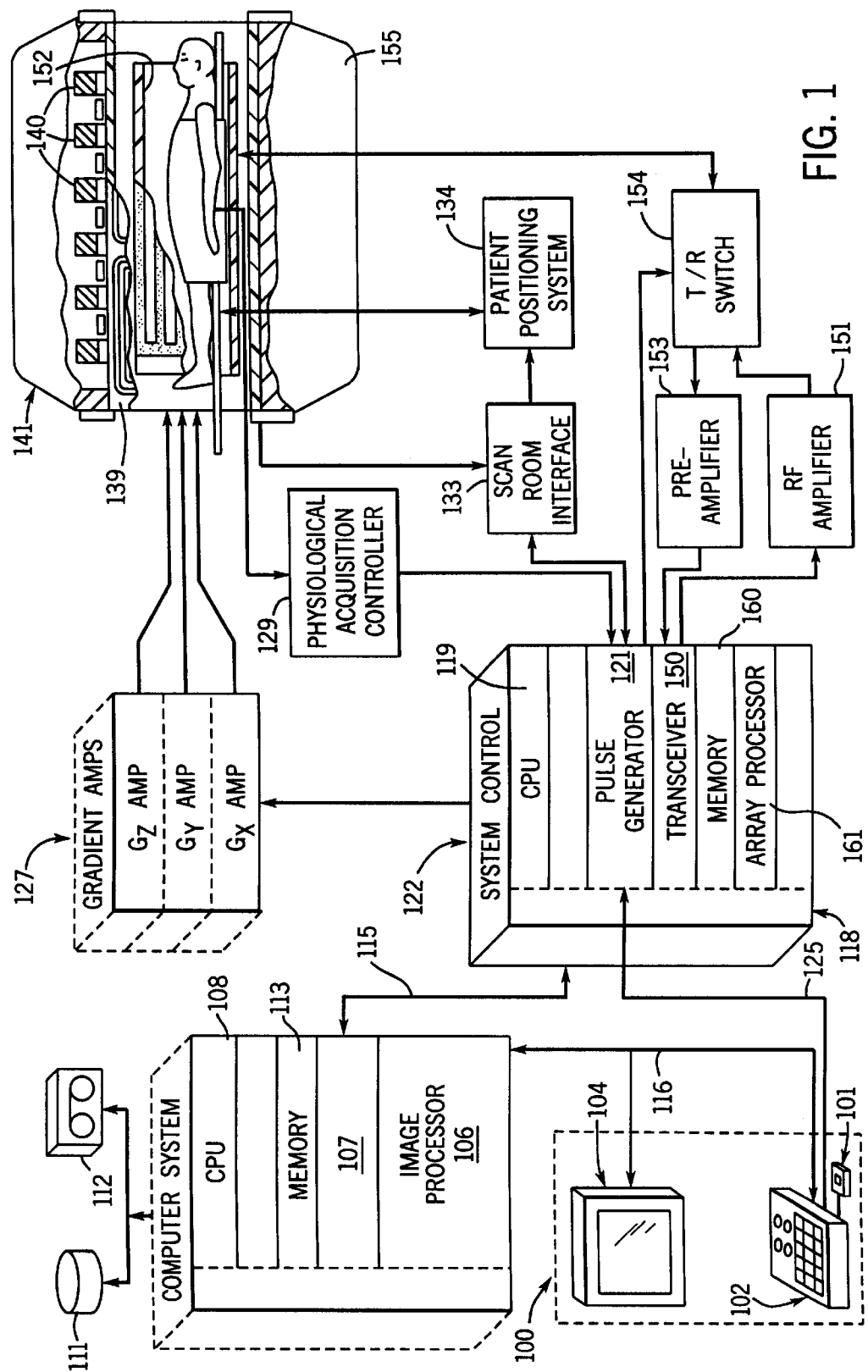
FIG. 1 is a block diagram of an embodiment of a MR imaging system according to the present invention.

Referring first to FIG. 1, there is shown the major components of a preferred MRI system which incorporates the present invention. The operation of the system is controlled from an operator console 100 which includes an input device 101, a control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
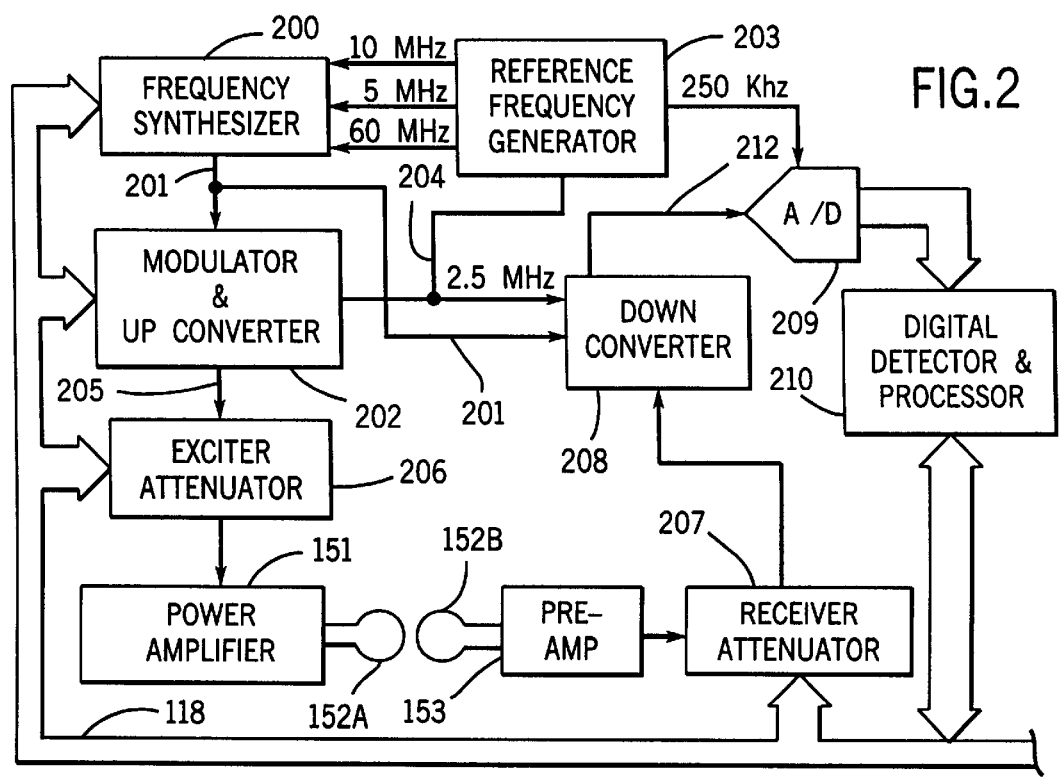
FIG. 2 is an electrical block diagram of the transceiver which forms part of the MR imaging system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuation 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

In one embodiment of the preferred embodiment, an operator interactively controls the image contrast of an MR image prior to its acquisition or an MR image during its acquisition. Such interactive image contrast control is accomplished from the operator console 100 (also referred to as the operator interface) using the input device 101. The input device 101 is selected from a group including, but not limited to, a mouse, a joystick, a keyboard, a trackball, a touch screen, a light wand, and a voice control. The MR imaging system of the present invention is capable of imaging in any desired orientation within the structure of interest and is equipped to perform both real-time acquisitions and non real-time acquisitions. In particular, real-time refers to continuous acquisition and reconstruction of MR image data as rapidly as it is acquired and displayed in approximately one second or less, as constrained by system performance.

Figure 3:
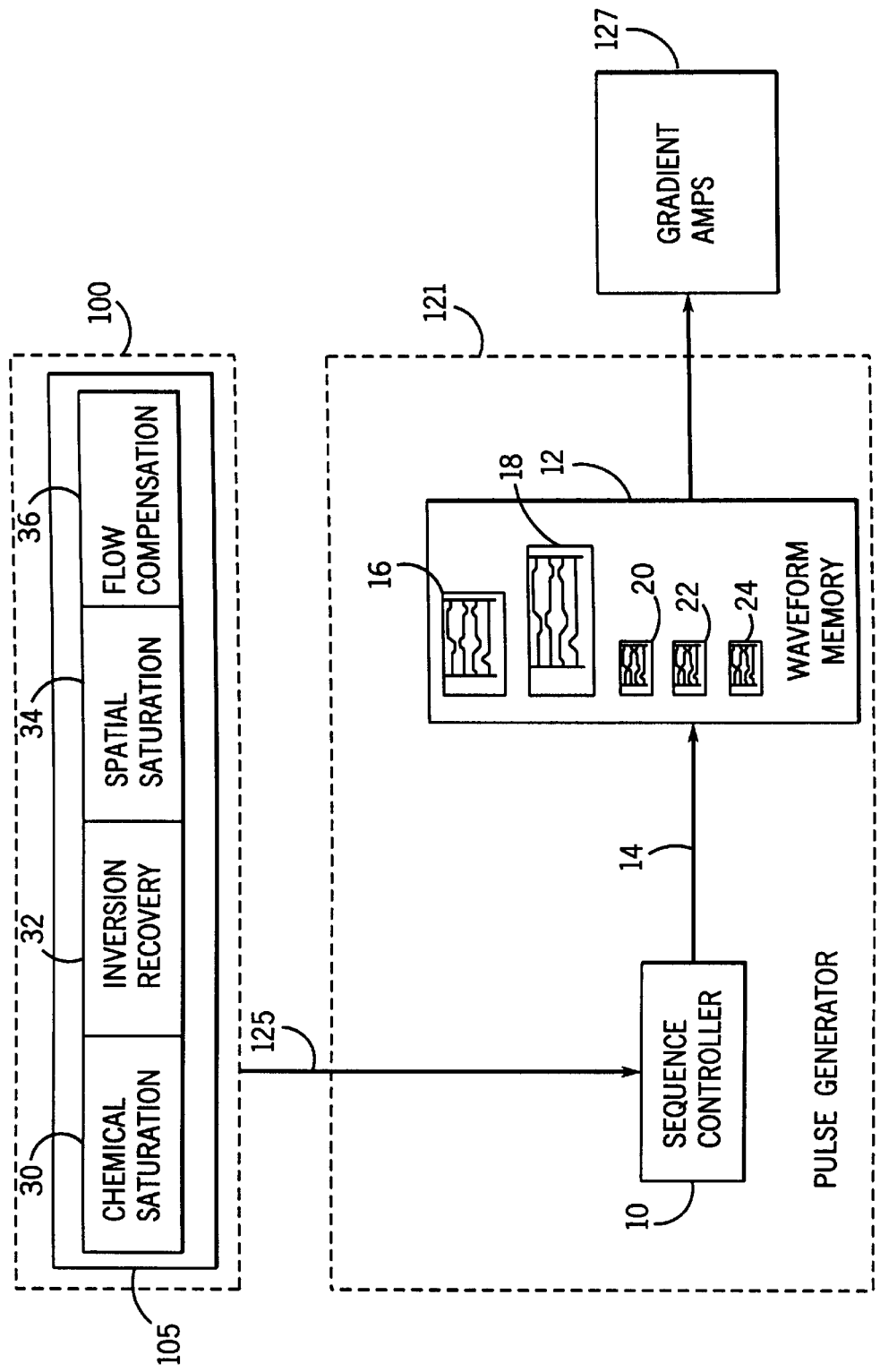
FIG. 3 is a more detailed block diagram of the pulse generator which forms part of the MR imaging system of FIG. 1.

FIG. 3 shows the major components used in an embodiment of the present invention. Pulse generator module 121 includes a sequence controller 10 which connects to a waveform memory 12 through a communication link 14. A graphical user interface 105 and MR images of the structure of interest (not shown in FIG. 3) are displayed on the display 104 of the MR imaging system. The operator interacts with the graphical user interface 105 using the input device 101. The graphical user interface 105 includes a chemical saturation icon 30, a inversion recovery icon 32, a spatial saturation icon 34, and a flow compensation icon 36. The link 125 connecting the operator console 100 to the pulse generator module 121 communicates image contrast controls from the operator console 100 to the sequence controller 10.

Waveform memory 12 stores multiple sets of RF and gradient waveform segments, each set corresponding to a distinct imaging mechanism or image contrast mechanism. Each set of RF and gradient waveform segments is assigned a distinct memory address in waveform memory 12 such that each set of RF and gradient waveform segments is accessible from waveform memory 12. In the preferred embodiment, imaging waveform segments, corresponding to imaging mechanisms, include a set of base imaging waveform segment 16 and a set of flow compensation imaging waveform segment 18. Image contrast waveform segments, corresponding to image contrast mechanisms, include a set of chemical saturation waveform segment 20, a set of inversion recovery waveform segment 22, and a set of spatial saturation waveform segment 24. It should be understood that the waveforms depicted in the figures are for illustration purposes only and do not represent the actual waveforms in waveform memory 12.

In another embodiment of the preferred embodiment, image contrast mechanisms available in the MR imaging system, and correspondingly sets of waveform segments stored in waveform memory 12, can also include, but is not limited to: variable TE, variable TR, variable receiver bandwidth, variable flip angle, variable spatial resolution, field of view, slice thickness, slice spacing, multiple slices, multiple passes, no-phase-wrap, asymmetric field of view, fractional Ky (legacy-fractional nex), fractional Kx (legacy-fractional echo), velocity encoding, respiratory compensation, cardiac compensation, multiple repetitions (legacy-multi-phase), and color flow.

In detail, the preferred embodiment uses real-time MR imaging. To interactively prescribe the image contrast in real-time, the operator selects the desired image contrast mechanism by "clicking" on icon 30, 32, or 34 on the graphical user interface 105 (for example, icon 30 for chemical saturation). The operator also selects one imaging mechanism. In the preferred embodiment, the operator selects the flow compensation mechanism by clicking on the flow compensation icon 36, or the base imaging mechanism by not clicking on any imaging waveform segment icons. Thus, the base imaging waveform segment, corresponding to the base imaging mechanism, is the default imaging mechanism.

Figure 4:
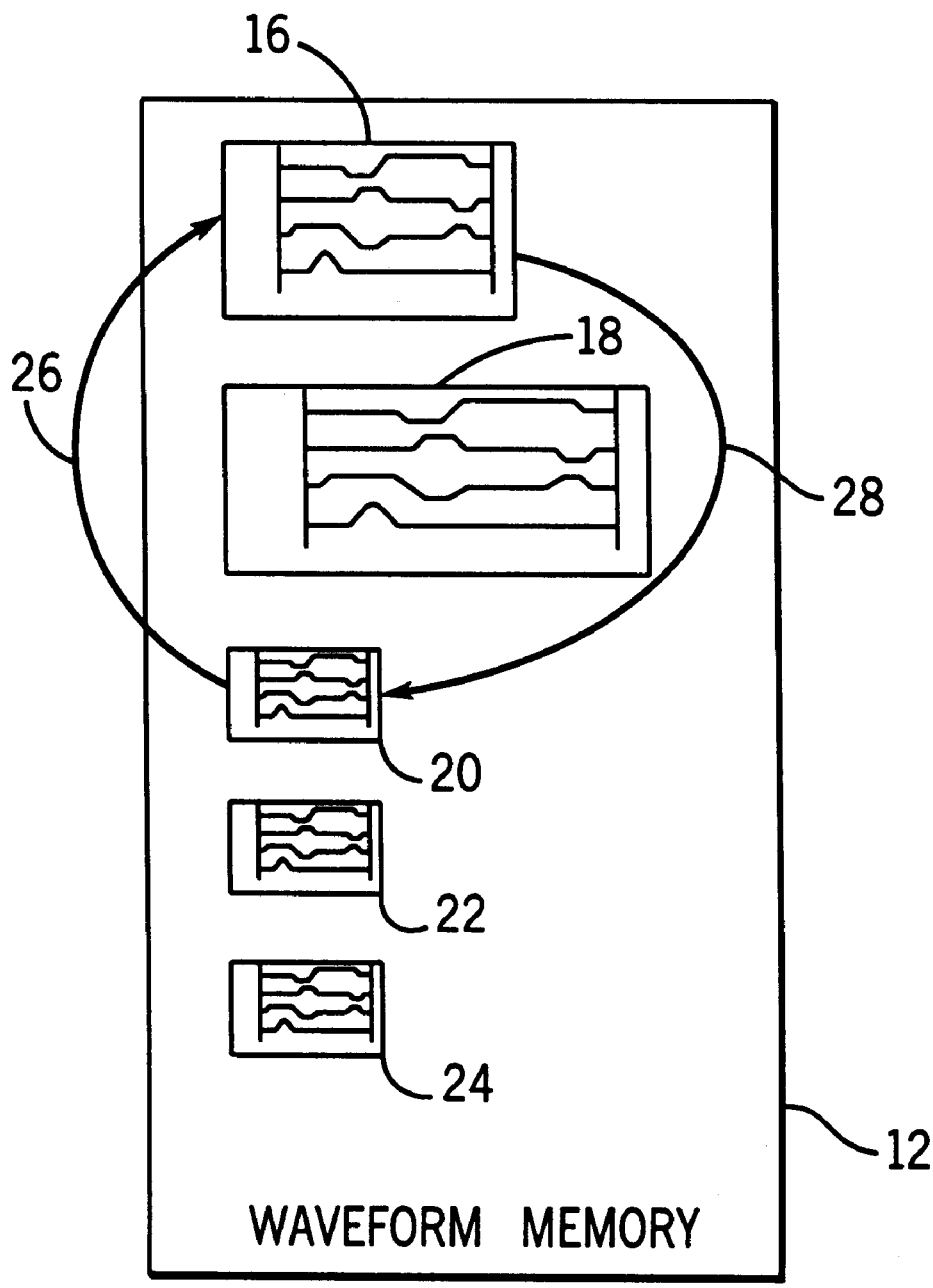
FIG. 4 is a block diagram of the waveform memory which forms part of the MR imaging system of FIG. 1.

Sequence controller 10 receives the operator's selection(s) via link 125 from the operator console 100, The sequence controller 10 first accesses the image contrast waveform segment corresponding to the selected image contrast mechanism (continuing the example, chemical saturation waveform segment 20). Second, the sequence controller 10 accesses the selected imaging waveform segment (continuing the example, base imaging waveform segment 16) almost instantaneously in time, to dynamically link 26 selected image contrast waveform segment to the selected imaging waveform segment as shown in FIG. 4. In this manner, a dynamically linked MR imaging pulse sequence, comprised of the selected image contrast waveform segment followed by the selected imaging waveform segment, is constructed. Then the sequence controller 10 applies this dynamically linked MR imaging pulse sequence to the gradient amplifier system 127 to be executed or "played out" such that MR data can be acquired.

Next, the sequence controller 10 accesses the selected image contrast waveform segment (continuing the example, chemical saturation waveform segment) again, almost instantaneously in time, to construct the next dynamically linked 28 MR imaging pulse sequence. Access and execution of the selected image contrast waveform segment and the selected imaging waveform segment occurs repeatedly in this cyclic manner with appropriate modifications to the MR imaging pulse sequence at each cycle or repetition to acquire enough MR data in accordance with the resolution of the proposed MR image to be displayed. For example, an MR image with 256 phase encoding views would require the MR imaging pulse sequence to be executed 256 times in standard spin-warp MR imaging. The final result, after acquisition and reconstruction in real-time, is a MR image with the selected image contrast mechanism (in this example, chemical saturation).

In the preferred embodiment, the selected image contrast waveform segment comprises the first portion of the constructed MR imaging pulse sequence. Moreover, the operator has the option of selecting more than one image contrast mechanism for a proposed MR image or not selecting any image contrast mechanisms for a proposed MR image. In the first case of selecting more than one image contrast mechanism for a proposed MR image, the dynamically linked MR imaging pulse sequence would contain all the selected image contrast waveform segments first following by the imaging waveform segment. The order of the image contrast waveform segments is determined by predetermined order or some appropriate algorithm already prescribed in the MR imaging system. In the second case of not selecting any imaging contrast mechanism for a proposed MR image, the dynamically linked MR imaging pulse sequence would only contain the selected imaging waveform segment. Hence, the advantage of independently invoking waveform segments to construct the MR imaging pulse sequence, as needed at run-time, becomes apparent in real-time imaging where minimal scan time is of the essence.

To further interactively prescribe the image contrast in real-time, the operator may select the desired image contrast and/or imaging mechanisms prior to initiating scanning or the operator can select the desired image contrast and/or imaging mechanisms while a scan is in progress. When the operator selects the desired image contrast and/or imaging mechanisms while a scan is in progress, the MR imaging system may instantaneously (e.g., in less than 100 milliseconds) replace the current sets of waveform segments with new sets of waveform segments corresponding to the newly selected mechanisms. Although not shown in the figures, the graphical user interface 105 may additionally include icons for the operator to prescribe how the MR imaging system should deal with the scan in progress. Alternatively, the MR imaging system may have prescribed rules which dictate what should be done to the scan in progress. For example, the MR imaging system may halt the current scan and/or halt the current MR image from being displayed; instead the sequence controller 10 may immediately initiate a new scan with the newly selected waveform segments. Alternatively, the MR imaging system may complete the current scan in progress and display the current MR image acquired; then the sequence controller 10 may initiate a new scan with the newly selected waveform segments. In still another alternative, the newly selected waveform segments may be used to finish the current scan in progress such that the resulting MR image is a conglomeration or hybrid of the current scan with the current waveform segments and the new scan with the newly selected waveform segments.

To still further interactively prescribe the image contrast in real-time, the operator can directly modify the image contrast in real-time. Although not shown in the figures, the graphical user interface may include icons configured to allow the operator to directly modify individual gradient and RF amplitudes, pulse widths, and/or relative timing within each waveform segment. The direct modification may be accomplished graphically (e.g., slide bar icons) or explicitly (e.g., specific numerical values). Thus, in this manner, the preferred embodiment provides interactive and acquisition time saving image contrast controls to the operator.

Figure 5:
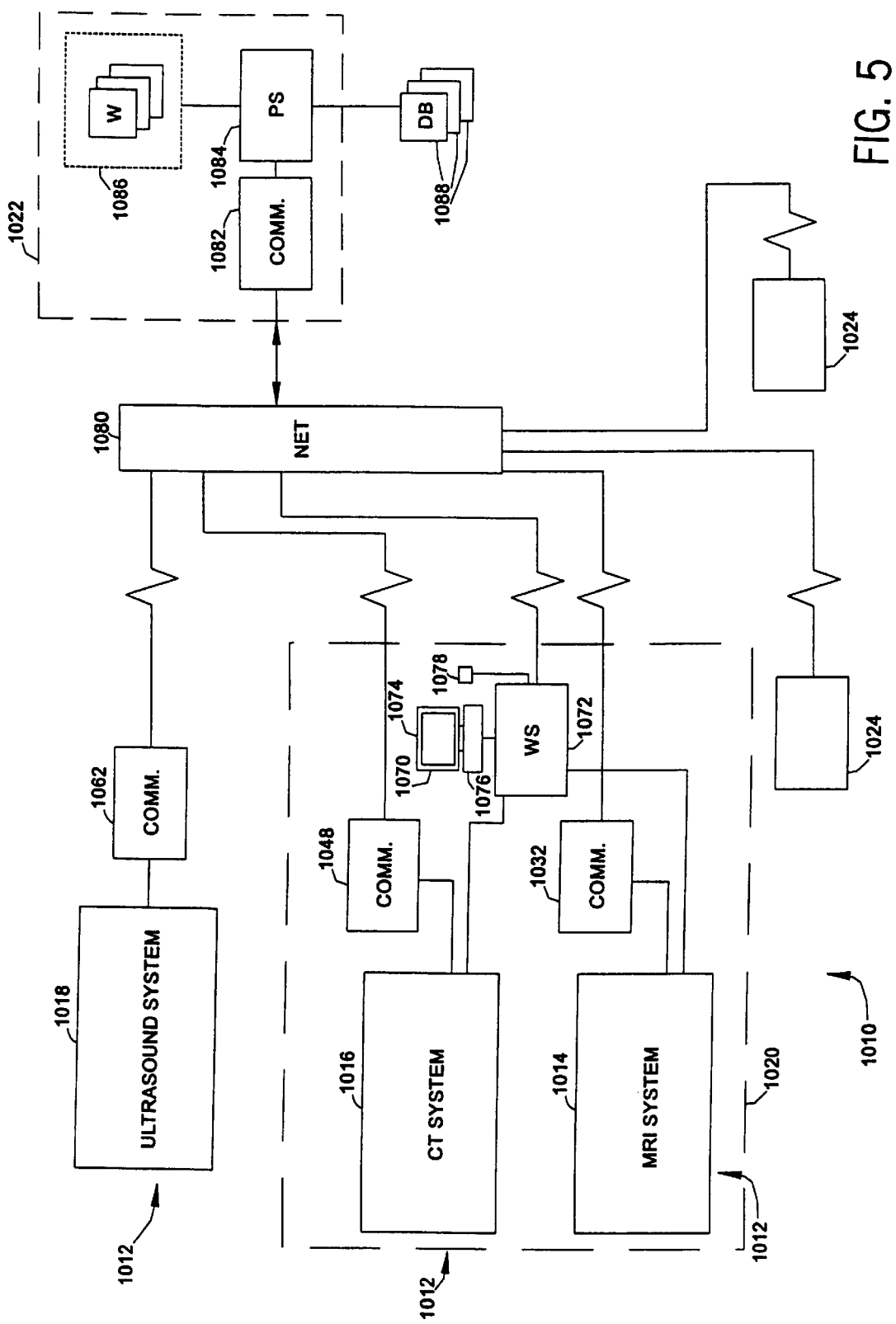
FIG. 5 is a diagrammatical representation of a series of medical diagnostic systems coupled to a service facility via a network connection for providing remote services and data interchange between the diagnostic systems and the service facility.

Referring now to FIG. 5, a service system 1010 is illustrated for providing remote service to a plurality of medical diagnostic systems 1012, including system such as the MR imaging system described with reference to FIG. 1. In the embodiment illustrated in FIG. 5, the medical diagnostic systems include a magnetic resonance imaging (MRI) system 1014, a computed tomography (CT) system 1016, and an ultrasound imaging system 1018. The diagnostic systems may be positioned in a single location or facility, such as a medical facility 1020, or may be remote from one another as shown in the case of ultrasound system 1018. The diagnostic systems are serviced from a centralized service facility 1022. Moreover, a plurality of field service units 1024 may be coupled in the service system for transmitting service requests, verifying service status, transmitting service data and so forth as described more fully below.

In the exemplary embodiment of FIG. 5, several different system modalities are provided with remote service by the service facility, Remote services include but are not limited to services, such as, remote monitoring, remote system control, immediate file access from remote locations, remote file storage and archiving, remote resource pooling, remote recording, and remote high speed computations. Remote services are provided to a particular modality depending upon the capabilities of the service facility, the types of diagnostic systems subscribing to service contracts with the facility, as well as other factors.

Depending upon the modality of the systems, various subcomponents or subsystems will be included. In the case of MRI system 1014, such systems will generally include a scanner, a control and signal detection circuit, a system controller, and an operator station. MRI system 1014 includes a uniform platform for interactively exchanging service requests, messages and data with service facility 1022 as described more fully below. MRI system 1014 is linked to a communications module 1032, which may be included in a single or separate physical package from MRI system 1014. In a typical system, additional components may be included in system 1014, such as a printer or photographic system for producing reconstructed images based upon data collected from the scanner.

Similarly, CT system 1016 will typically include a scanner, a signal acquisition unit, and a system controller. The scanner detects portions of x-ray radiation directed through a subject of interest. The controller includes circuitry for commanding operation of the scanner and for processing and reconstructing image data based upon the acquired signals. CT system 1016 is linked to a communications module 1048 for transmitting and receiving data for remote services. Moreover, like MRI system 1014, CT system 1016 will generally include a printer or similar device for outputting reconstructed images based upon data collected by the scanner.

In the case of ultrasound system 1018, such systems will generally include a scanner and data processing unit and a system controller. Ultrasound system 1018 is coupled to a communications module 1062 for transmitting service requests, messages and data between ultrasound system 1018 and service facility 1022.

Although reference is made herein generally to "scanners" in diagnostic systems, that term should be understood to include medical diagnostic data acquisition equipment generally, not limited to image data acquisition, as well as to picture archiving communications and retrieval systems, image management systems, facility or institution management systems, viewing systems and the like, in the field of medical diagnostics.

Where more than one medical diagnostic system is provided in a single facility or location, as indicated in the case of MRI and CT systems 1014 and 1016 in FIG. 5, these may be coupled to a management station 1070, such as in a radiology department of a hospital or clinic. The management station may be linked directly to controllers for the various diagnostic systems. The management system may include a computer workstation or personal computer 1072 coupled to the system controllers in an intranet configuration, in a file sharing configuration, a client/server arrangement, or in any other suitable manner. Moreover, management station 1070 will typically include a monitor 1074 for viewing system operational parameters, analyzing system utilization, and exchanging service requests and data between the facility 1020 and the service facility 1022. Input devices, such as a standard computer keyboard 1076 and mouse 1078, may also be provided to facilitate the user interface.

It should be noted that, alternatively, the management system, or other diagnostic system components, may be "stand-alone" or not coupled directly to a diagnostic system. In such cases, the service platform described herein, and some or all of the service functionality nevertheless be provided on the management system. Similarly, in certain applications, a diagnostic system may consist of a stand-alone or networked picture archiving communications and retrieval system or a viewing station provided with some or all of the functionality described herein.

The communication modules mentioned above, as well as workstation 1072 and field service units 1024 may be linked to service facility 1022 via a remote access network 1080. For this purpose, any suitable network connection may be employed. Presently preferred network configurations include both proprietary or dedicated networks, as well as open networks, such as the Internet. Data may be exchanged between the diagnostic systems, field service units, and remote service facility 1022 in any suitable format, such as in accordance with the Internet Protocol (IP), the Tranmission Control Protocol (TCP), or other known protocols. Moreover, certain of the data may be transmitted or formatted via markup languages such as the HyperText Markup Language (HTML), or other standard languages. The presently preferred interface structures and communications components are described in greater detail below.

Within service facility 1022, messages, service requests and data are received by communication components as indicated generally at reference numeral 1082. Components 1082 transmit the service data to a service center processing system, represented generally at reference numeral 1084 in FIG. 5. The processing system manages the receipt, handling and transmission of service data to and from the service facility. In general, processing system 1084 may include one or a plurality of computers, as well as dedicated hardware or software servers for processing the various service requests and for receiving and transmitting the service data as described more fully below.

Service facility 1022 also includes a bank of operator workstations 1086 which may be staffed by personnel who address the service requests and provide off and on-line service to the diagnostic systems in response to the service requests. Also, processing system 1084 may be linked to a system of databases or other processing systems 1088 at or remote from the service facility 1022. Such databases and processing systems may include extensive database information on operating parameters, service histories, and so forth, both for particular subscribing scanners, as well as for extended populations of diagnostic equipment.

Figure 6:
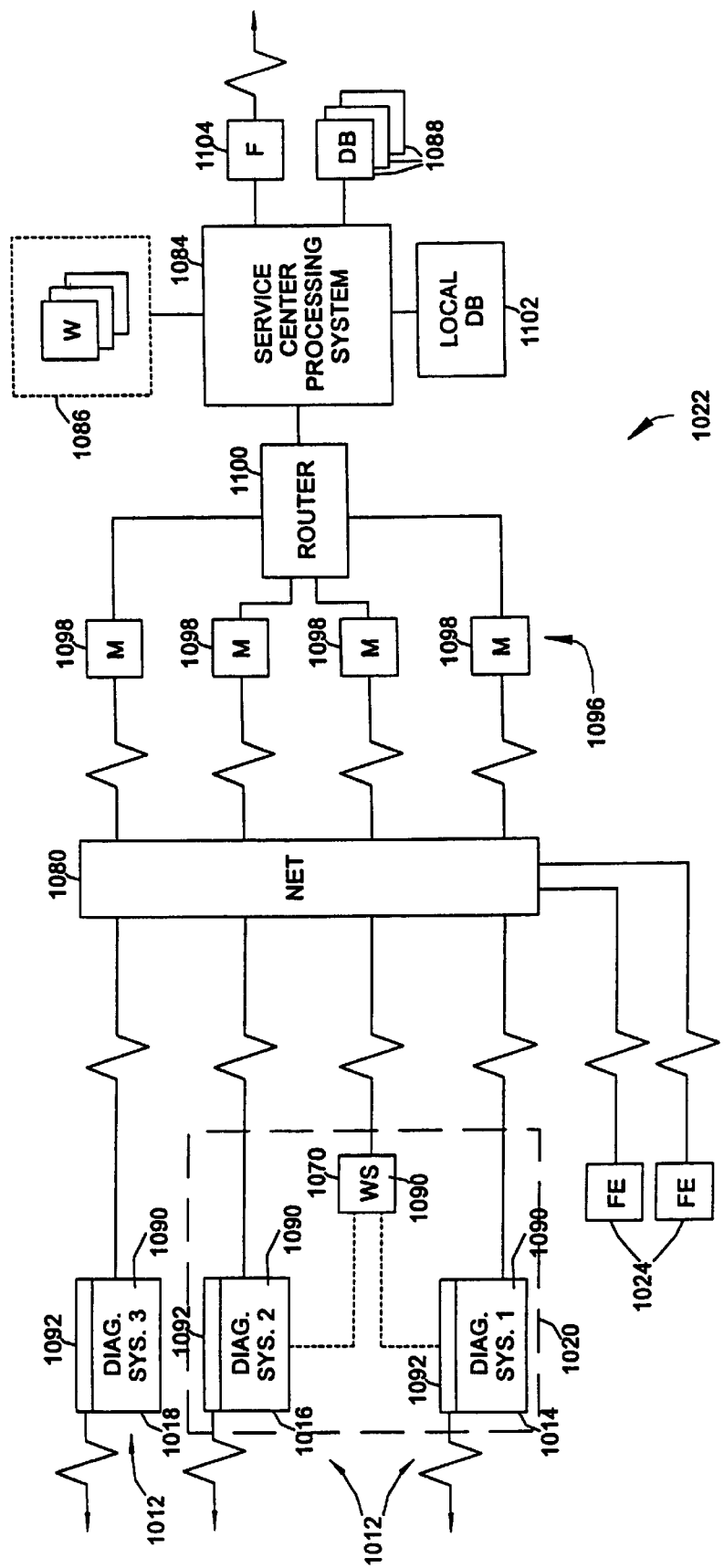
FIG. 6 is a block diagram of the systems shown in FIG. 5 illustrating certain functional components of the diagnostic systems and the service facility.

FIG. 6 is a block diagram illustrating the foregoing system components in a functional view. As shown in FIG. 6, the field service units 1024 and the diagnostic systems 1012 can be linked to the service facility 1022 via a network connection as illustrated generally at reference numeral 1080. Within each diagnostic system 1012, a uniform service platform 1090 is provided.

Platform 1090, which is described in greater detail below with particular reference to FIG. 7, includes hardware, firmware, and software components adapted for composing service requests, transmitting and receiving service data, establishing network connections and managing financial or subscriber arrangements between diagnostic systems and the service facility. Moreover, the platforms provide a uniform graphical user interface at each diagnostic system, which can be adapted to various system modalities to facilitate interaction of clinicians and radiologists with the various diagnostic systems for service functions. The platforms enable the scanner designer to interface directly with the control circuitry of the individual scanners, as well as with memory devices at the scanners, to access image, log and similar files needed for rendering requested or subscribed services. Where a management station 1070 is provided, a similar uniform platform is preferably loaded on the management station to facilitate direct interfacing between the management station and the service facility. In addition to the uniform service platform 1090, each diagnostic system is preferably provided with an alternative communications module 1092, such as a facsimile transmission module for sending and receiving facsimile messages between the scanner and remote service facilities.

Messages and data transmitted between the diagnostic systems and the service facility traverse a security barrier or "firewall" contained within processing system 1084 as discussed below, which prevents unauthorized access to the service facility in a manner generally known in the art. A modem rack 1096, including a series of modems 1098, receives the incoming data, and transmits outgoing data through a router 1100 which manages data traffic between the modems and the service center processing system 1084.

In the diagram of FIG. 6, operator workstations 1086 are coupled to the processing system, as are remote databases or computers 1088. In addition, at least one local service database 1102 is provided for verifying license and contract arrangements, storing service record files, log files, and so forth. Moreover, one or more communication modules 1104 are linked to processing system 1084 to send and receive facsimile transmissions between the service facility and the diagnostic systems or field service units.

Figure 7:
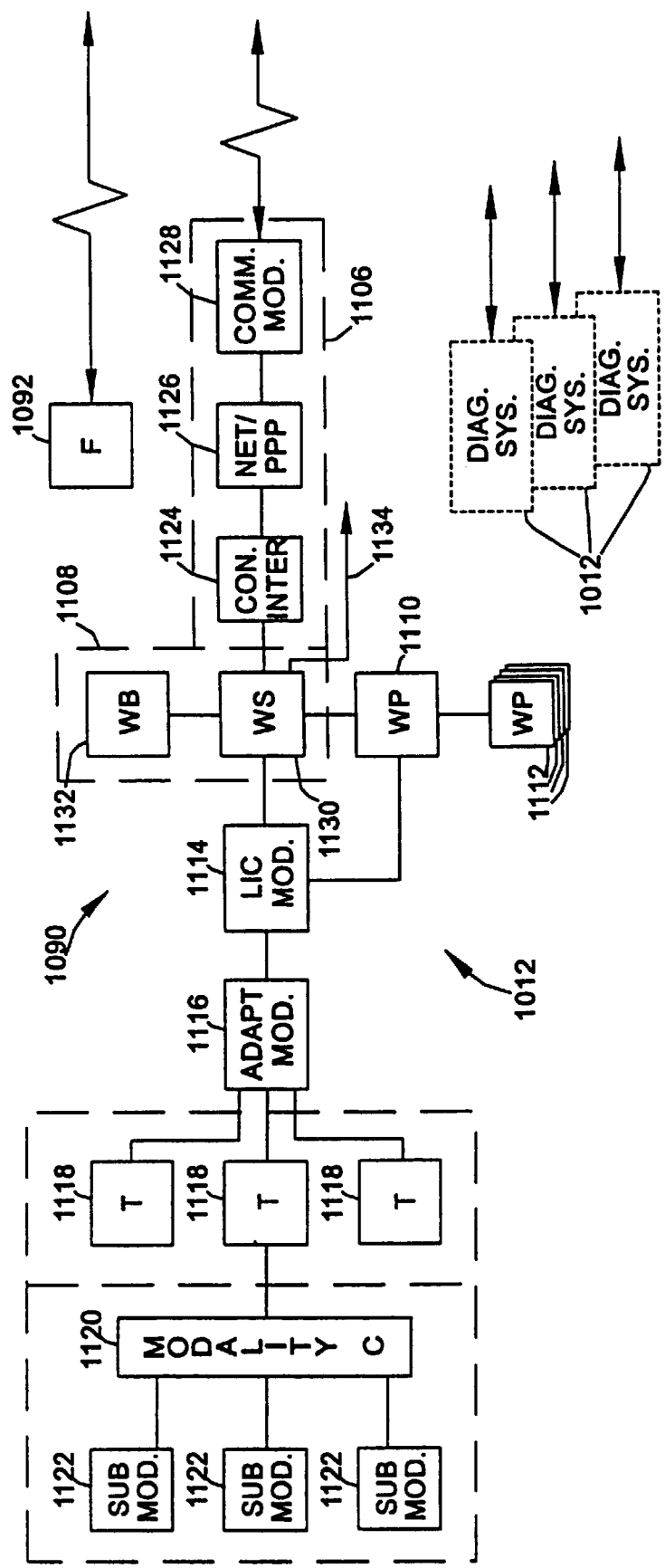
FIG. 7 is a block diagram of certain functional components within a diagnostic system of the type shown in FIG. 5 and FIG. 6 for facilitating interactive remote servicing of the diagnostic system.

FIG. 7 illustrates diagrammatically the various functional components comprising the uniform service platform 1090 within each diagnostic system 1012. As shown in FIG. 7, the uniform platform includes a device connectivity module 1106, as well as a network connectivity module 1108. Network connectivity module 1108 accesses a main web page 1110 which, as mentioned above, is preferably a markup language page, such as an HTML page displayed for the system user on a monitor at the diagnostic system. Main web page 1110 is preferably accessible from a normal operating page in which the user will configure examination requests, view the results of examinations, and so forth such as via an on-screen icon. Through main web page 1110, a series of additional web pages 1112 are accessible. Such web pages permit remote service requests to be composed and transmitted to the remote service facility, and facilitate the exchange of other messages, reports, software, protocols, and so forth as described more fully below.

It should be noted that as used herein the term "page" includes a user interface screen or similar arrangement which can be viewed by a user of the diagnostic system, such as screens providing graphical or textual representations of data, messages, reports and so forth. Moreover, such pages may be defined by a markup language or a programming language such as Java, Perl, Java script, or any other suitable language.

Network connectivity module 1108 is coupled to a license module 1114 for verifying the status of license, fee or contractual subscriptions between the diagnostic system and the service facility. As used herein, the term "subscription" should be understood to include various arrangements, contractual, commercial or otherwise for the provision of services, information, software, and the like, both accompanies with or without payment of a fee. Moreover, the particular arrangements manages by systems as described below may include several different types of subscriptions, including time-expiring arrangements, one-time fee arrangements, and so-called "pay per use" arrangements, to mention but a few.

License module 1114 is, in turn, coupled to one or more adapter utilities 1116 for interfacing the browser, server, and communications components with modality interface tools 1118. In a presently preferred configuration, several such interface tools are provided for exchanging data between the system scanner and the service platform. For example, modality interface tools 1118 may include applets or servlets for building modality-specific applications, as well as configuration templates, graphical user interface customization code, and so forth. Adapters 1116 may interact with such components, or directly with a modality controller 1120 which is coupled to modality-specific subcomponents 1122.

The modality controller 1120 and modality-specific subcomponents 1122 will typically include a preconfigured processor or computer for executing examinations, and memory circuitry for storing image data files, log files, error files, and so forth. Adapter 1116 may interface with such circuitry to convert the stored data to and from desired protocols, such as between the HyperText Transfer Protocol (HTTP) and DICOM, a medical imaging standard for data presentation. Moreover, transfer of files and data as described below may be performed via any suitable protocol, such as a file transfer protocol (FTP) or other network protocol.

In the illustrated embodiment, device connectivity module 1106 includes several components for providing data exchange between the diagnostic system and the remote service facility. In particular, a connectivity service module 1124 provides for interfacing with network connectivity module 1108. A Point-to-Point Protocol (PPP) module 1126 is also provided for transmitting Internet Protocol (IP) packets over remote communication connections. Finally, a modem 1128 is provided for receiving and transmitting data between the diagnostic system and the remote service facility. As will be appreciated by those skilled in the art, various other network protocols and components may be employed within device connectivity module 1106 for facilitating such data exchange.

Network connectivity module 1108 preferably includes a server 1130 and a browser 1132. Server 1130 facilitates data exchange between the diagnostic system and the service facility, and permits a series of web pages 1110 and 1112 to be viewed via browser 1132. In a presently preferred embodiment, server 1130 and browser 1132 support HTTP applications and the browser supports java applications. Other servers and browsers, or similar software packages may, of course, be employed for exchanging data, service requests, messages, and software between the diagnostic system, the operator and the remote service facility. Finally, a direct network connection 1134 may be provided between server 1130 and an operator workstation, such as management station 1070 within the medical facility (see FIGS. 5 and 6).

In a present embodiment, the components comprising network connectivity module may be configured via an application stored as part of the uniform platform. In particular, a Java application licensed to a service engineer enables the engineer to configure the device connectivity at the diagnostic system to permit it to connect with the service facility.

Figure 8:
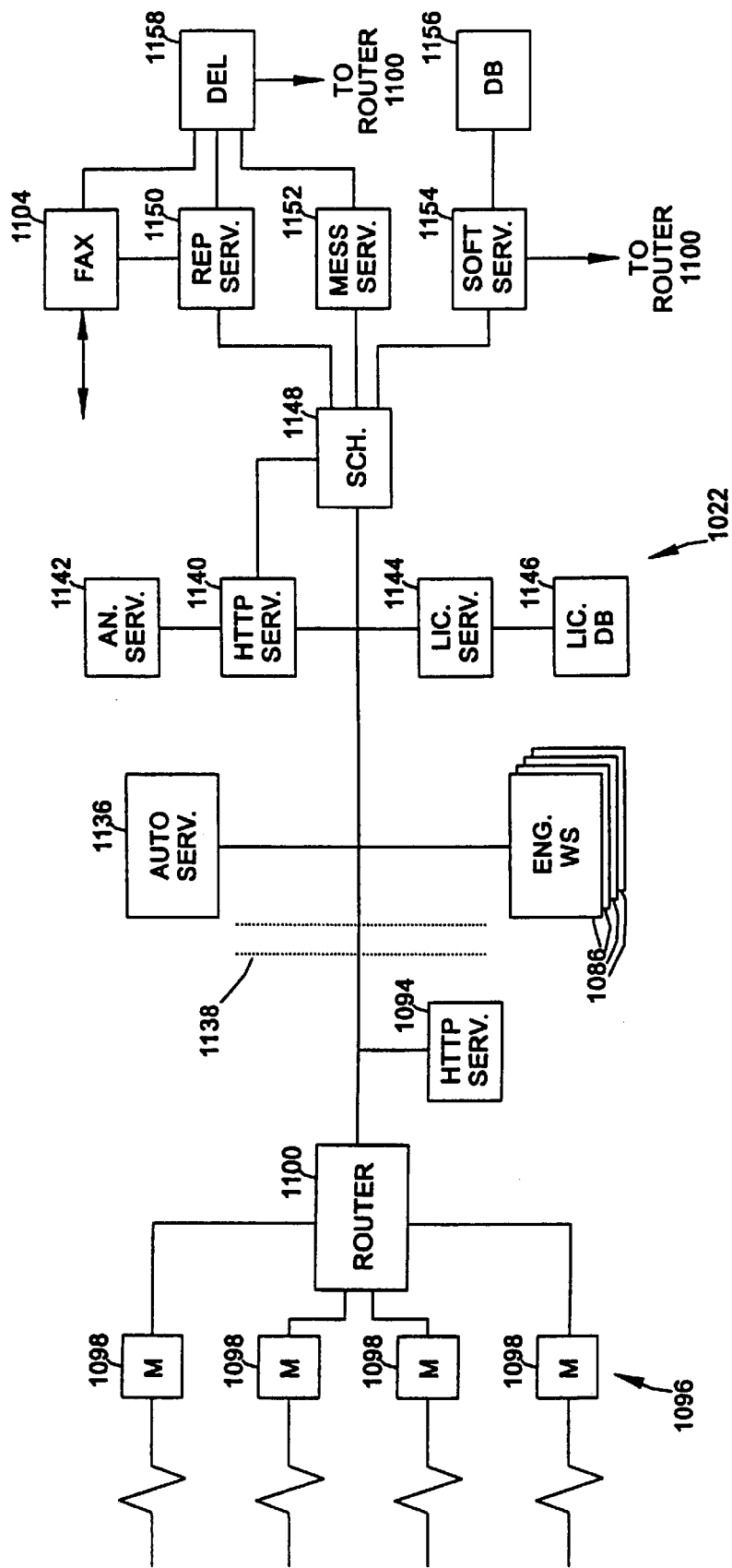
FIG. 8 is a block diagram of certain of the functional components of the service facility illustrated in FIG. 5 and FIG. 6 for rendering interactive remote service to a plurality of medical diagnostic systems.

FIG. 8 illustrates exemplary functional components for service facility 1022. As indicated above, service facility 1022 includes a modem rack 1096 comprising a plurality of modems 1098 coupled to a router 1100 for coordinating data communications with the service facility. An HTTP service server 1094 receives and directs incoming and outgoing transactions with the facility. Server 1094 is coupled to the other components of the facility through a firewall 1139 for system security. Operator workstations 1086 are coupled to the port manager for handling service requests and transmitting messages and reports in response to such requests.

An automated service unit 1136 may also be included in the service facility for automatically responding to certain service requests, sweeping subscribing diagnostic systems for operational parameter data, and so forth, as described below. In a presently preferred embodiment, the automated service unit may operate independently of or in conjunction with the interactive service components comprising processing system 1084. It should be noted that other network or communications schemes may be provided for enabling the service facility to communicate and exchange data and messages with diagnostic systems and remote service units, such as systems including outside Internet service providers (ISP's), virtual private networks (VPN's) and so forth.

Behind firewall 1138, an HTTP application server 1140 coordinates handling of service requests, messaging, reporting, software transfers and so forth. Other servers may be coupled to HTTP server 1140, such as service analysis servers 1142 configured to address specific types of service requests, as described more fully below. In the illustrated embodiment, processing system 1084 also includes a license server 1144 which is coupled to a license database 1146 for storing, updating and verifying the status of diagnostic system service subscriptions. Alternatively, where desired, license server 1144 may be placed outside of fire wall 1138 to verify subscription status prior to admission to the service facility.

Handling of service requests, messaging, and reporting is further coordinated by a scheduler module 1148 coupled to HTTP server 1140. Scheduler module 1148 coordinates activities of other servers comprising the processing system, such as a report server 1150, a message server 1152, and a software download server 1154. As will be appreciated by those skilled in the art, servers 1150, 1152 and 1154 are coupled to memory devices (not shown) for storing data such as addresses, log files, message and report files, applications software, and so forth. In particular, as illustrated in FIG. 8, software server 1154 is coupled via one or more data channels to a storage device 1156 for containing transmittable software packages which may be sent directly to the diagnostic systems, accessed by the diagnostic systems, or supplied on pay-per-use or purchase basis. Message and report servers 1152 and 1150 are further coupled, along with communications module 1104, to a delivery handling module 1158, which is configured to receive outgoing messages, insure proper connectivity with diagnostic systems, and coordinate transmission of the messages.

In a presently preferred embodiment, the foregoing functional circuitry may be configured as hardware, firmware, or software on any appropriate computer platform. For example, the functional circuitry of the diagnostic systems may be programmed as appropriate code in a personnel computer or workstation either incorporated entirely in or added to the system scanner. The functional circuitry of the service facility may include additional personal computers or workstations, in addition to a main frame computer in which one or more of the servers, the scheduler, and so forth, are configured. Finally, the field service units may comprise personal computers or laptop computers of any suitable processor platform. It should also be noted that the foregoing functional circuitry may be adapted in a variety of manners for executing the functions described herein. In general, the functional circuitry facilitates the exchange of remote service data between the diagnostic systems and a remote service facility, which is preferably implemented in an interactive manner to provide regular updates to the diagnostic systems of service activities.

As described above, both the diagnostic systems and the field service units preferably facilitate interfacing between a variety of diagnostic system modalities and the remote service facility via a series of interactive user-viewable pages. Exemplary pages include capabilities of providing interactive information, composing service requests, selecting and transferring messages, reports and diagnostic system software, and so forth. Pages facilitate the interaction and use of remote services, such as, remote monitoring, remote system control, immediate file access from remote locations, remote file storage and archiving, remote resource pooling, remote recording, and remote high speed computations.

The user can access specific documents described in text areas of the pages by selection of all or a portion of the text describing the documents. In the presently preferred embodiment, the accessed documents may be stored in local memory devices within the diagnostic system, or selection of the text may result in loading of a uniform resource locator (URL) for accessing a remote computer or server via a network link.

Service system 1010 (FIG. 5) provides remote services, such as, remote control, remote diagnostics, and remote servicing. Advantageously, service system 1010 (FIG. 5) allows the MRI system described with reference to FIG. 1 to be controlled from a remote location. As such, skilled system operators or physicians may operate the MRI system without either the physician travelling to the patient or the patient travelling to the physician. In particular, service system 1010 provides interactive image contrast control of a MR imaging system over a network. Service system 1010 also allows the MRI system to be serviced by a remote facility. As such, calibration, software upgrades, and other service operations are available via the network.

While the embodiments illustrated in the Figures and described above are presently preferred, it should be understood that the embodiments are offered by way of example only. Other embodiments may include enhanced remote services and features made possible by the networked system described above. The invention is not limited to a particular embodiment, but extends to various modifications, combinations, and permutations that nevertheless fall within the scope and spirit of the appended claims.

What is claimed is:

1. An interactive magnetic resonance (MR) imaging system, comprising:
    a MR imaging device configured to acquire and reconstruct MR data in real-time of a current imaging section and displaying a MR image in real-time of the current imaging section;
    a network coupling the MR imaging device and a remote facility, the network providing remote services to the MR imaging device;
    an operator interface coupled to the MR imaging device and the network to permit an operator to select from a plurality of image contrast mechanisms;
    a memory coupled to the MR imaging device to store a plurality of image contrast waveform segments and at least one imaging waveform segment, wherein each of the plurality of image contrast waveform segments and the at least one imaging waveform segment is distinctly addressable such that each waveform segment can be independently accessed from the memory; and a sequence controller coupled to the memory to dynamically link the selected image contrast waveform segments and one imaging waveform segment, causing the MR imaging device to acquire a new image with the selected waveform segment mechanisms.

2. The interactive magnetic resonance (MR) imaging system of claim 1, wherein the remote services comprise calibration of the MR imaging device.

3. The interactive magnetic resonance (MR) imaging system of claim 1, wherein the remote services comprise upgrades in software used to operate the MR imaging device.

4. The interactive magnetic resonance (MR) imaging system of claim 1, wherein the remote services comprise service diagnosis for maintenance and repair of the MR imaging device.

5. The interactive magnetic resonance (MR) imaging system of claim 1, wherein the remote services comprise remote control of image parameters and mechanisms of the MR imaging device.

6. The interactive magnetic resonance (MR) imaging system of claim 1, wherein the remote services comprise management of contractual subscriptions between the MR imaging device and the remote facility.

7. The interactive magnetic resonance (MR) imaging system of claim 1, wherein the remote services comprise remote storage of MR data and images from the MR imaging device.

8. The interactive magnetic resonance (MR) imaging system of claim 1, wherein the remote services comprise remote access to MR data and images from the MR imaging device.

9. The interactive MR imaging system of claim 1, wherein the operator interface includes a plurality of icons on a display screen for displaying the available image contrast mechanisms.

10. The interactive MR imaging system of claim 1, wherein the memory stores a flow compensation imaging waveform segment.

11. The interactive MR imaging system of claim 1, wherein the plurality of image contrast waveform segments stored in the memory includes a spatial saturation waveform segment, a chemical saturation waveform segment, and an inversion recovery waveform segment.

12. A method for interactively and remotely controlling the image contrast of a real-time magnetic resonance (MR) image produced in a MR system, comprising:

a) establishing a communication connection over a network between the MR system and a remote facility;

b) storing a plurality of image contrast waveform segments in a waveform memory of the MR system;

c) storing at least one imaging waveform segment in the waveform memory of the MR system;

d) selecting from the plurality of image contrast waveform segments stored in the waveform memory;

e) selecting from the at least one imaging waveform segment stored in the waveform memory;

f) constructing a MR imaging pulse sequence in real-time by a sequence controller dynamically linking the selected image contrast waveform segment to the selected imaging waveform Segment stored in the waveform memory at run-time;

g) acquiring MR data using the dynamically linked MR imaging pulse sequence in real-time;

h) reconstructing the MR data acquired in real-time; and i) displaying the newly acquired MR image as the current image.

13. The method of claim 12, wherein storing a plurality of image contrast waveform segments includes storing waveform segments from a group including an inversion recovery waveform segment, a chemical saturation waveform segment, and a spatial saturation waveform segment.

14. The method of claim 12, wherein storing at least one imaging waveform segment includes storing a flow compensation waveform segment.

15. The method of claim 12, further comprising repeating steps (f) to (i) a plurality of repetitions with appropriate modifications to the MR imaging pulse sequence at each repetition to acquire enough MR data in accordance with the resolution of the proposed MR image to be displayed.

16. The method of claim 12, wherein selecting from the plurality of image contrast waveform segments and selecting from at least one imaging waveform segment is a default base imaging waveform segment stored in the waveform memory when no explicit selection is made.

17. The method of claim 12, wherein selecting from the plurality of image contrast waveform segments stored in the waveform memory includes selecting more than one image contrast waveform segments.

18. The method of claim 12, wherein constructing a MR imaging pulse sequence includes the sequence controller sequentially accessing the selected plurality of contrast waveform segments in the waveform memory then the selected imaging waveform segment in the waveform memory.

19. The method of claim 18, wherein constructing a MR imaging pulse sequence further includes dynamically linking the selected imaging waveform segment to the end of the plurality of image contrast waveform segments selected.

20. The method of claim 12, further comprising the step of halting the current acquisition of MR data, the acquisition commencing with at least one current waveform segment, which is in progress at the time when a selection of at least one waveform segment is made on the MR system and halting the displaying of the current MR image resulting therefrom, such that steps (f) to (i) for the selected at least one waveform segment can commence.

21. The method of claim 20, further comprising instantaneously replacing the at least one current waveform segment with the selected at least one waveform segment prior to step (f).

22. The method of claim 12, further comprising completing the acquisition of MR data, the acquisition commencing with at least one current waveform segment, which is in progress at the time when a selection of at least one waveform segment is made in the MR system and further completing the displaying of the MR image resulting therefrom, then commencing steps (f) to (i) with the selected at least one waveform segment.

23. The method of claim 22, further comprising instantaneously replacing the at least one current waveform segment with the selected at least one waveform segment prior to step (f).

24. The method of claim 12, further comprising the step of instantaneously replacing at least one current waveform segment of the current MR data acquisition in progress with an at least one new waveform segment, wherein the at least one new waveform segment is selected while the current MR data acquisition is in progress, and completing the current MR data acquisition in progress with the at least one new waveform segment such that the resulting MR image is a hybrid image of the at least one current waveform segment and the at least one new waveform segment scan.

25. The method of claim 12, further comprising modifying the MR imaging pulse sequence from a modification step selected from a group including modifying an individual gradient amplitude comprising the MR image pulse sequence, modifying a radio frequency (RF) amplitude comprising the MR image pulse sequence, modifying a pulse width comprising the MR image pulse sequence, and modifying a relative timing within the MR imaging pulse sequence.

26. An interactive magnetic resonance (MR) imaging system, comprising:
   a) means for establishing a communication connection over a network between the MR system and a remote facility;
   b) means for storing a plurality of image contrast waveform segments in a waveform memory of the MR system;
   c) means for storing at least one imaging waveform segment in the waveform memory of the MR system;
   d) means for selecting from the plurality of image contrast waveform segments stored in the waveform memory;
   e) means for selecting from the at least one imaging waveform segment stored in the waveform memory;
   f) means for constructing a MR imaging pulse sequence in real-time by a sequence controller dynamically linking the selected image contrast waveform segment to the selected imaging waveform segment stored in the waveform memory at run-time;
   g) means for acquiring MR data using the dynamically linked MR imaging pulse sequence in real-time;
   h) means for reconstructing the MR data acquired in real-time; and
   i) means for displaying the newly acquired MR image as the current image.

27. The system of claim 26, wherein means for storing a plurality of image contrast waveform segments includes waveform segments from a group including an inversion recovery waveform segment, a chemical saturation waveform segment, and a spatial saturation waveform segment.

28. The system of claim 26, wherein means for storing at least one imaging waveform segment includes a flow compensation waveform segment.

* * * * *

UNITED STATES PATENT AND TRADEMARK OFFICE
CERTIFICATE OF CORRECTION

PATENT NO. : 6,362,620 B1
DATED : March 26, 2002
INVENTOR(S) : Debbins et al.

It is certified that error appears in the above-identified patent and that said Letters Patent is hereby corrected as shown below:

Column 1,
Line 12, after "6,166,544" insert a -- . --;

Column 7,
Lines 18-19, delete "selection(s)" and substitute -- selection(s) (as one word);

Column 11,
Lines 63-64, delete "accom-panies" and substitute -- accompanied --;
Line 65, delete "manages" and substitute -- managed --;

Column 13,
Line 5, delete "1139" and substitute -- 1138 --;

Column 15,
Line 65, delete "Segment" and substitute -- segment --.

Signed and Sealed this

Eighteenth Day of June, 2002

*Attest:*

JAMES E. ROGAN
*Director of the United States Patent and Trademark Office*

*Attesting Officer*